United States Patent
Jeon

(10) Patent No.: US 9,478,767 B2
(45) Date of Patent: Oct. 25, 2016

(54) ORGANIC LIGHT EMITTING DISPLAY

(71) Applicant: Samsung Display Co., Ltd., Yongin, Gyeonggi-do (KR)

(72) Inventor: Hee-Chul Jeon, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/512,234

(22) Filed: Oct. 10, 2014

(65) Prior Publication Data

US 2015/0123102 A1    May 7, 2015

(30) Foreign Application Priority Data

Oct. 14, 2013  (KR) .................. 10-2013-0121657

(51) Int. Cl.
| | |
|---|---|
| *H01L 29/08* | (2006.01) |
| *H01L 21/00* | (2006.01) |
| *H01L 51/52* | (2006.01) |
| *H01L 27/32* | (2006.01) |

(52) U.S. Cl.
CPC ......... *H01L 51/525* (2013.01); *H01L 27/3244* (2013.01)

(58) Field of Classification Search
CPC . H01L 27/30; H01L 27/3239; H01L 31/143; H01L 31/162; H01L 33/08; H01L 33/18; H01L 33/24; H01L 51/5032; H01L 25/048; H01L 27/288; H01L 27/32
USPC .............. 257/13, 79–103, 918, 40, 642–643, 257/759; 438/22–47, 69, 493, 503, 507, 438/956
See application file for complete search history.

(56) References Cited

U.S. PATENT DOCUMENTS

| | | | | |
|---|---|---|---|---|
| 8,431,930 | B2 * | 4/2013 | Park et al. | ...................... 257/59 |
| 2010/0148157 | A1 * | 6/2010 | Song et al. | ..................... 257/40 |
| 2010/0207107 | A1 * | 8/2010 | Kim | ................................ 257/40 |
| 2011/0049502 | A1 * | 3/2011 | Jun | ..................... H01L 27/3246 257/40 |

FOREIGN PATENT DOCUMENTS

| | | |
|---|---|---|
| JP | 2012-252834 A | 12/2012 |
| KR | 10-2010-0093221 A | 8/2010 |
| KR | 10-1427593 B1 | 8/2014 |

* cited by examiner

*Primary Examiner* — Selim Ahmed
*Assistant Examiner* — Moin Rahman
(74) *Attorney, Agent, or Firm* — Knobbe Martens Olson & Bear LLP

(57) ABSTRACT

An organic light emitting display includes a first substrate comprising a major surface, and a pixel array formed over the major surface of the first substrate. The pixel array comprises a plurality of pixels formed over the first substrate and a plurality of spacers arranged over the first substrate. Each pixel comprises a first electrode and an organic emission layer formed over the first electrode. The pixel array provides a plurality of recesses and a plurality of bumps, and the plurality of recesses correspond to the first electrodes of the plurality of pixels and the plurality of bumps corresponds to the plurality of spacers. When viewing the pixel array from the top in a first direction perpendicular to the major surface, each spacer is interposed between two immediately neighboring recesses and a row of spacers are arranged along a first axis, and each recess has a first width taken along the first axis and a second width taken along a second axis parallel to the first axis, the first width being smaller than the second width.

14 Claims, 6 Drawing Sheets

ORGANIC LIGHT EMITTING DISPLAY

RELATED APPLICATIONS

This application claims priority to and the benefit of Korean Patent Application No. 10-2013-0121657, filed on Oct. 14, 2013, in the Korean Intellectual Property Office, the entire contents of which are incorporated herein by reference in their entirety.

BACKGROUND

1. Field

The present disclosure relates to an organic light emitting display.

2. Description of the Related Art

With the development of display technologies, display devices have come into wide use in not only household display devices such as TVs and monitors but also portable devices such as notebook computers, cellular phones and portable media players (PMPs). As the display devices become lighter in weight and thinner in thickness, a liquid crystal display, an organic light emitting display and the like have come into the spotlight.

Among these display devices, the organic light emitting display is self-luminescent using an organic material, and has low power consumption and high luminance characteristics. The organic light emitting display is a next-generation display having the self-luminescent characteristic, and has superior characteristics to a liquid crystal display (LCD) in terms of viewing angle, contrast, response speed, and the like.

Accordingly, demands for organic light emitting displays have increased, and various studies have been conducted to develop an organic light emitting display having lower power consumption and higher luminance characteristics while increasing the lifespan thereof.

SUMMARY

Embodiments provide an organic light emitting display having a spacer which can minimize the contact area between the spacer and an encapsulation substrate.

Embodiments also provide an organic light emitting display which can prevent a stain transferred to an encapsulation substrate by an external force from being overlapped with an emission layer.

Embodiments also provide an organic light emitting display which can improve emission efficiency by providing shapes of a new opening (e.g., light emitting area) and a new spacer, and ensure the uniformity of luminance (e.g., based on transmittance).

According to an aspect of the present invention, there is provided an organic light emitting display, including: a first substrate comprising a major surface; and a pixel array formed over the major surface of the first substrate, the pixel array comprising a plurality of pixels formed over the first substrate and a plurality of spacers arranged over the first substrate, and each pixel comprising a first electrode and an organic emission layer formed over the first electrode, the pixel array providing a plurality of recesses and a plurality of bumps, the plurality of recesses corresponding to the first electrodes of the plurality of pixels and the plurality of bumps corresponding to the plurality of spacers, wherein when viewing the pixel array from the top in a first direction perpendicular to the major surface, each spacer is interposed between two immediately neighboring recesses and a row of spacers are arranged along a first axis, and each recess has a first width taken along the first axis and a second width taken along a second axis parallel to the first axis, the first width being smaller than the second width.

Each spacer may comprise a base portion and a top portion placed on the base portion, the base portion being wider than the top portion in a cross section taken by a plane parallel to the first axis and perpendicular to the major surface.

The tip of the top portion may be rounded.

The base portion may comprise generally semicircular or trapezoidal sides in a cross section taken by a plane parallel to the first axis and perpendicular to the major surface.

The pixel array may further include a second electrode formed over the organic emission layer and the plurality of spacers, and a protective layer formed on the second electrode.

The width of the recess may be the shortest when measured along the first axis and gradually increasing when measured along another axis parallel to the first axis.

When viewing the pixel array from the top in a first direction perpendicular to the major surface, the recess may have a center line along the first axis, and the center line may be equidistant from each of the two ends of the recess along a third axis that is perpendicular to the first axis and parallel to the major surface.

When viewing the pixel array from the top in a first direction perpendicular to the major surface, the recess has a center line that divides the recess into first and second portions, the widest width of the first portion measured along the first axis may be substantially equal to the widest width of the second portion measured along the first axis.

The width of the recess along the center line may be about 20% to about 60% of the widest width of the first or second portion.

The spacer may be adjacent to a central portion of the recess that is on the first axis.

When viewing the pixel array from the top in a first direction perpendicular to the major surface, the shape of the spacer may complement the portion of the recess that is on the first axis.

When viewing the pixel array from the top in a first direction perpendicular to the major surface, the spacer has a shape that is generally circular or rhomboidal.

The organic light emitting display may further include a thin film transistor coupled to the first electrode.

The organic light emitting display may further include a second substrate disposed opposite to the first substrate, the second substrate being spaced apart from the first substrate at a predetermined interval by the spacer.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1A:
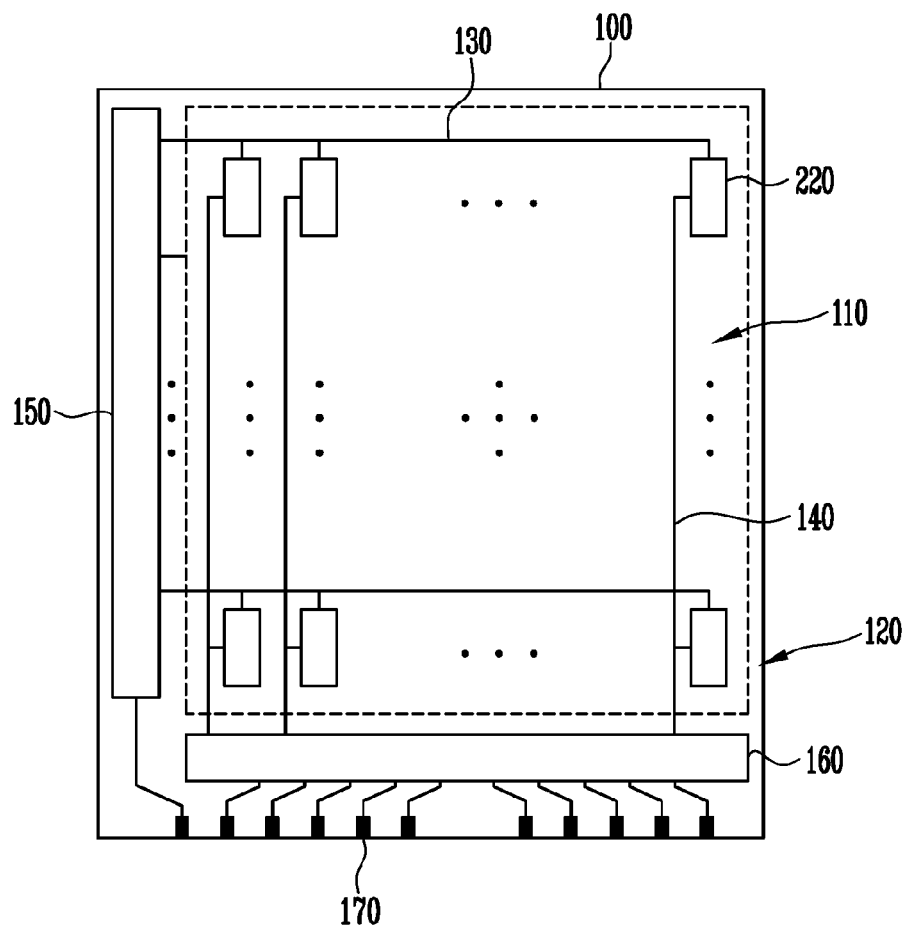
FIG. 1A is a schematic plan view illustrating an organic light emitting display according to an embodiment of the present invention.

Hereinafter, certain exemplary embodiments according to the present invention will be described with reference to the accompanying drawings. Here, when a first element is described as being coupled to a second element, the first element may be not only directly coupled to the second element but may also be indirectly coupled to the second element via a third element. Further, some of the elements that are not essential to the complete understanding of the invention are omitted for clarity. Also, like reference numerals refer to like elements throughout.

In the accompanying drawings, an active matrix (AM) organic light emitting display of a 2Tr-1Cap structure having two thin film transistors (TFTs) and one capacitor in one pixel is described, but the present invention are not limited thereto. Therefore, the organic light emitting display may have three or more TFTs and two or more capacitors in one pixel. The organic light emitting display may have various structures as a separate wire is further formed. Here, the pixel refers to a minimum unit that displays an image, and the organic light emitting display displays an image through a plurality of pixels.

Figure 1B:
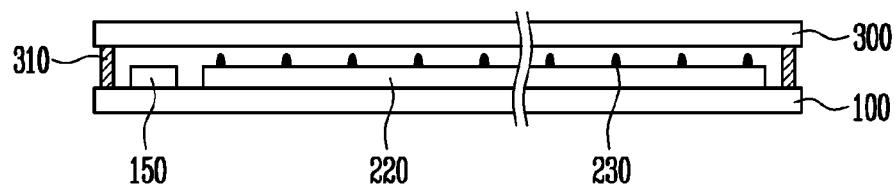
FIG. 1B is a sectional view of the organic light emitting display shown in FIG. 1A according to an embodiment of the present invention.

FIG. 1A is a schematic plan view illustrating an organic light emitting display according to an embodiment of the present invention. FIG. 1B is a sectional view of the organic light emitting display shown in FIG. 1A.

The organic light emitting display according to this embodiment may include a pixel area 110 and a non-pixel area 120, which are configured with a plurality of layers on a first substrate 100. The non-pixel area 120 is provided to surround the pixel area 110, and may include an area other than the pixel area 110.

The pixel area 110 (e.g., pixel array shown in FIGS. 2, 4, and 5) has a plurality of organic light emitting diode devices 220 disposed on the first substrate 100. Here, the plurality of organic light emitting diode devices 220 are coupled in a matrix form between scan and data lines 130 and 140. The non-pixel area 120 has scan and data lines 130 and 140, power supply lines (not shown) and scan and data drivers 150 and 160, which are disposed on the first substrate 100. Here, the scan and data lines 130 and 140 are respectively extended from the scan and data lines 130 and 140 in the pixel area 110. The power supply lines (not shown) are provided to operate the organic light emitting diode devices 220. The scan and data drivers 150 and 160 process signals provided from outside the organic light emitting display through pads 170 and supply the processed signals to the scan and data lines 130 and 140. The scan or data driver 150 or 160 includes a driving circuit for selectively driving each organic light emitting diode device 220 by converting a signal provided from the outside through the pad 170 into a scan or data signal.

Referring to FIG. 1B, a second substrate 300 (e.g., an encapsulation substrate) may be disposed opposite to the first substrate 100 so as to hermetically seal the pixel area 110 above the first substrate 100 having the organic light emitting diode devices 220 formed thereon, and side surfaces of the first and second substrates 100 and 300 may be bonded together by a sealing material 310. In this case, the second substrate 300 may be spaced apart from the first substrate 100 at a predetermined interval by a plurality of spacers 230 formed on the first substrate 100.

Figure 2:
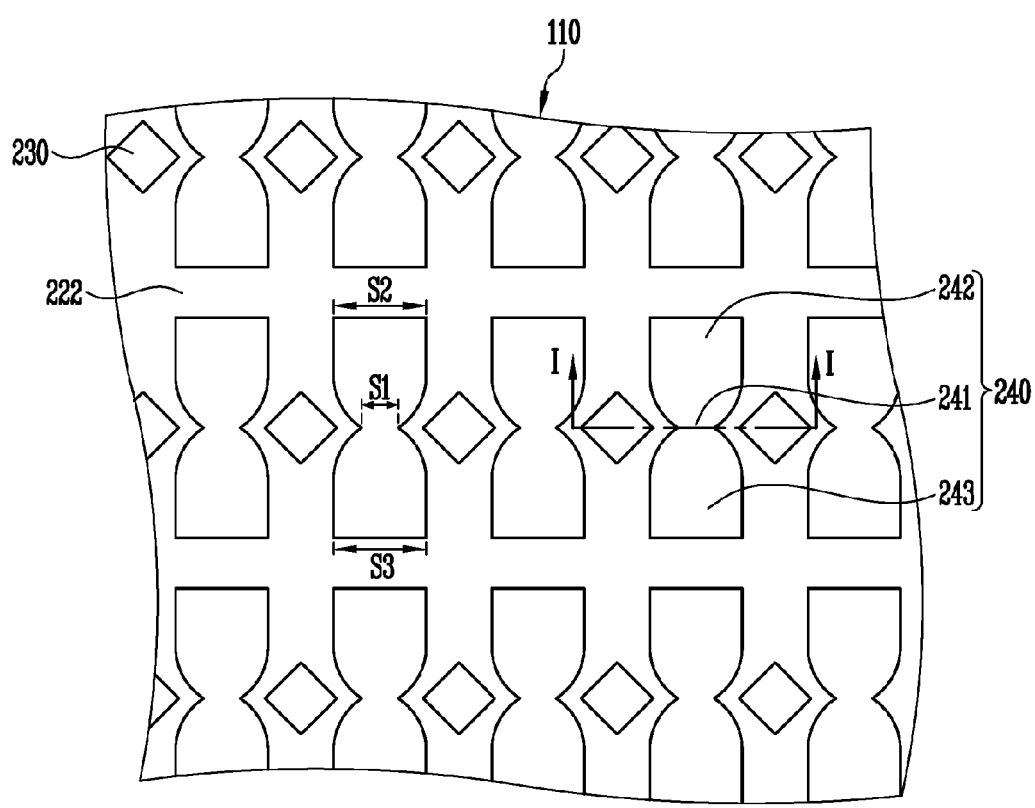
FIG. 2 is a top view showing only spacers and recesses in an organic light emitting display according to an embodiment of the present invention.
Figure 3:
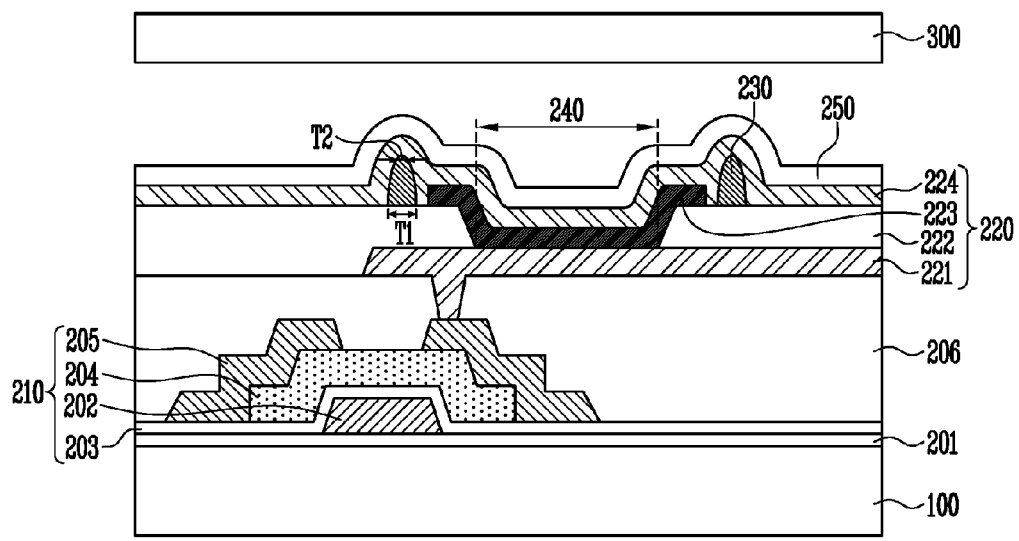
FIG. 3 is a sectional view taken along line I-I of FIG. 2 according to an embodiment of the present invention.

FIG. 2 is a top view showing only the spacers and recesses in an organic light emitting display according to an embodiment of the present invention. FIG. 3 is a sectional view taken along line I-I of FIG. 2 according to an embodiment of the present invention.

Referring to FIG. 2, the spacers 230 according to this embodiment may be arranged in the form of dots to be spaced apart from a plurality of recesses 240 arranged in row and column directions. In the present disclosure, the area indicated by 240 (e.g., a portion of the OLED device 220 that is recessed as shown in FIG. 3) is referred to as a recess for convenience. Alternatively, such recess can also be referred to as a recessed area, an opening, a light emitting area, or other labels that describe a similar feature. The organic light emitting diode device 220 may be provided such that at least one portion of the organic light emitting diode device 220 corresponds to the recess 240. Thus, the organic light emitting diode device 220 may emit light through the recess 240. In this case, a thin film transistor for controlling an operation of the organic light emitting diode device 220 and a capacitor for maintaining a signal may be coupled to the organic light emitting diode device 220. However, for convenience of illustration, only a thin film transistor 210 and the organic light emitting diode device 220 are shown in FIG. 3.

The organic light emitting display according to this embodiment includes: a plurality of first electrodes 221 formed on the first substrate 100; a pixel defining layer 222 formed on the first substrate 100 over the first electrodes 221, the pixel defining layer 222 having recesses 240 respectively formed such that the first electrodes 221 in emission areas are exposed therethrough; an organic emission layer 223 formed on the exposed first electrode 221; spacers 230 formed on the pixel defining layer 222; and a second electrode 224 formed above the first electrodes 221 over the organic emission layers 223 and the spacers 230. In this case, the spacer 230 is provided at an outside of the recess 240, and the width S1 (shown in FIG. 5) of a portion adjacent to the spacer 230 in the recess 240 may be smaller than the widths S2 or S3 of another portion of the recess 240. The organic light emitting display may further include a protective layer 250 formed on the second electrode 224 (e.g., configured to cover the spacers 230). For example, the protective layer 250 may be provided to protect a lower layer, and may be formed of an organic material. The organic material may include one or more of LiF, Liq, Alq3, NPB, TPD, m-MTDATA, and TCTA.

The organic light emitting diode device 220 may include a first electrode 221, a second electrode 224, and an organic emission layer 223 provided between the first and second electrodes 221 and 224. For example, the first electrode 221 may be an anode electrode, and the second electrode 224 may be a cathode electrode.

The plurality of first electrodes 221 may be formed on the first substrate 100 such that they are spaced apart from each other. The organic emission layer 223 may be formed to cover the recesses 240 (e.g., areas of the respective first electrodes 221 on which pixel defining layer 222 is not formed, as shown in FIG. 3) which are emission areas defined by the pixel defining layer 222. The organic emission layer 223 may include a hole injection layer, a hole transport layer, an electron transport layer, and an electron injection layer. The second electrode 224 may be formed above the first electrodes 221 over the organic emission layers 223.

The thin film transistor 210 may be electrically coupled to the first electrode 221. In the example of FIG. 3, the thin film transistor 210 includes a semiconductor layer 204 for providing source and drain regions and a channel region, a gate electrode 202 insulated from the semiconductor layer 204 by a gate insulating layer 203, and source and drain electrodes 205 coupled to the semiconductor layer 204 in the source and drain regions. A buffer layer 201 may be formed beneath the gate electrode 202, and a planarization insulating layer 206 may be formed on the source and drain electrodes 205.

Figure 6:
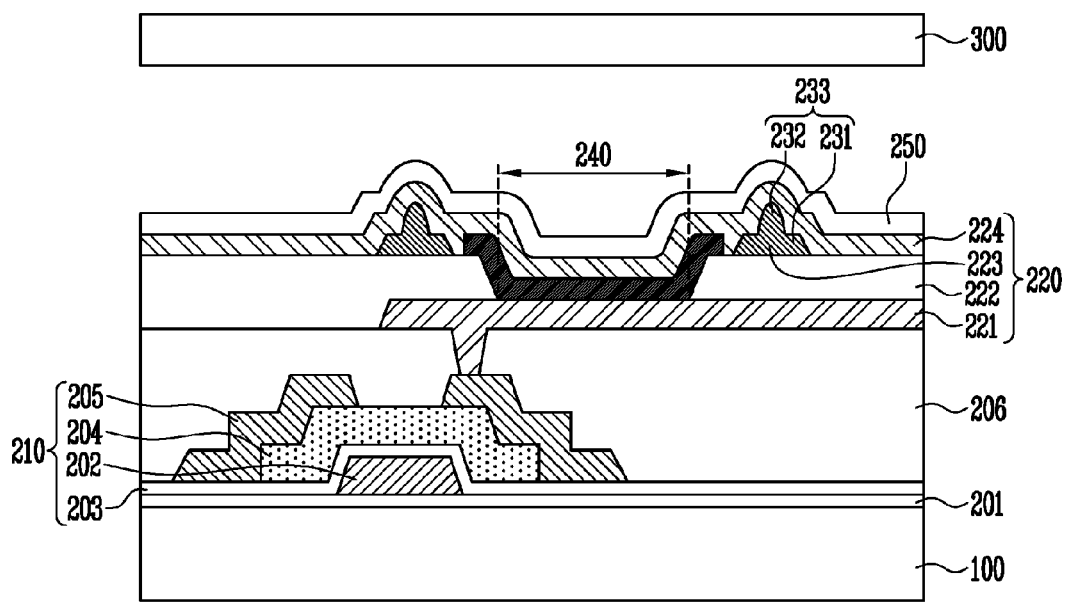
FIG. 6 is a sectional view taken along line II-II of FIG. 5 according to an embodiment of the present invention.

The plurality of spacers 230 are formed on the pixel defining layer 222, and may be spaced apart from each other and formed adjacent to the boundaries of the recesses 240. The spacers 230 may be arranged in the form of a mask (not shown) for selectively depositing an organic material or in the form of dots so as to uniformly and stably maintain the interval between the second and first substrates 300 and 100. In order to decrease the contact area of the spacer 230 with the second substrate 300, the spacer 230 may be provided such that the width T1 (shown in FIG. 3) of a lower portion adjacent to the pixel defining layer 222 is greater than the width T2 of an upper portion of the spacer 230. In addition, the spacer 230 may be provided such that an upper portion of the spacer 230 (e.g., a portion of the spacer 230 that faces the second substrate 300) is rounded. In one example, the section of the spacer 230 that is substantially perpendicular to the first substrate 100 may be formed in a semicircular or trapezoidal shape, for example, as shown in FIG. 6.

In the spacer 230, the width T1 of the lower portion adjacent to the pixel defining layer 222 may be greater than that T2 of the upper portion, such that the spacer 230 can stably support the second substrate 300 when the second substrate 300 is drooped downward. The second electrode 224 and the protective layer 250 may be provided on the spacer 230. In a case where the second substrate 300 is contacted with the protective layer 250, by decreasing the contact area between the protective layer 250 and the second substrate 300, the area of a stain transferred to the second substrate 300 may also be decreased. In this case, the upper portion of the spacer 230 may be rounded, such that the contact area between the protective layer 250 and the second substrate 300 is decreased and the impact applied to the second substrate 300 is thereby reduced.

As described above, the organic light emitting display according to this embodiment may be provided with the second electrode 224, the protective layer 250, and the second substrate 300, which are sequentially formed on the spacer 230. For example, the second substrate 300 of the organic light emitting display is an encapsulation substrate, which is provided to protect a device and the like inside the organic light emitting display.

In order to check a failure caused by an external impact, a ball drop test may be performed on the organic light emitting display. The ball drop test is a test for checking a crack in the second substrate, a droop of the second substrate, or the like by dropping a steel ball (weight of 43.75 g and diameter of 22 mm) on a predetermined point of the second substrate 300 from the above the second substrate 300. The ball drop test is used to simulate an impact that may frequently occur due to characteristics of the organic light emitting display. In the ball drop test, the second substrate 300 may come in contact with the protective layer 250 by being drooped downward. In this case, the protective layer 250 may be made of, for example, an organic material, and a portion of the protective layer 250 may be transferred onto and stain the second substrate 300. The stain transferred to the second substrate 300 may block light passing through the second substrate 300.

Generally, in a case where the second substrate comes in contact with the protective layer by being drooped downward, the second substrate ends up compressing the protective layer, and therefore, the stain transferred to the second substrate is larger than the shape of an upper portion of the protective layer. Accordingly, the stain formed on the second substrate after the second substrate is returned to the original state covers the recess, i.e., the emission area, and the portion covered by the stain is visualized as a stain due to the generation of a luminance difference caused by a transmittance difference.

In this embodiment, the organic light emitting display can be provided with the spacer 230 and the recess 240, which are designed such that even when a stain is transferred to the second substrate 300 due to the contact between the second substrate 300 and the protective layer 250, the stain does not cover the recess, i.e., the emission area. In the organic light emitting display according to this embodiment, the function of the spacer 230 is maintained, and simultaneously, it is possible to improve emission efficiency by increasing the area of the recess 240.

The portion at which the protective layer 250 and the second substrate 300 come in contact with each other may be influenced by the spacer 230 provided beneath the protective layer 250. Since the size of the recess 240 is related to the emission efficiency, the shape of the upper portion of the spacer 230 can minimize the stain of the protective layer 250 that is transferred to the second substrate 300, while maximizing the size of the recess 240.

The recess 240 according to this embodiment may be formed in a dumbbell or ribbon shape where end portions (e.g., in the longitudinal direction) of the recess 240 are larger than the center portion of the recess 240. In this case, the spacer 230 may be provided adjacent to the portion having the narrowest width in the recess 240. For example, the recess 240 may include a central portion 241 provided with the narrowest width 51, an upper portion 242, and a lower portion 243 respectively provided such that their widths are gradually increased as they get farther away from the central portion 241. The distance from the central portion 241 to the end of the upper portion 242 may be substantially identical to that from the central portion 241 to the end of the lower portion 243, and the width S2 of the widest portion of the upper portion 242 may be substantially equal to the width S3 of the widest portion of the lower portion 243. The spacer 230 may be provided adjacent to the central portion 241 of the recess 240.

That is, the recess 240 may be provided such that the central portion 241 is formed at the center of the recess 240, and the upper and lower portions 242 and 243 are symmetrically provided on the respective sides of the recess 240. The spacer 230 may be provided adjacent to the central portion 241 having the narrowest width in the recess 240. In this case, the shape of the spacer 230 may be configured to complement the shape of the central portion 241 in the recess 240. For example, the portion of the spacer 230 that faces the central portion 241 may mirror the shape of the central portion 241. As shown in FIG. 2, the portion of the spacer 230 that is closest to the central portion 241 of the recess 240 is shaped such that the tip of the portion closest to the central portion 241 fits into the indentation created by the central portion 241 (e.g., the waist formed at the center of the recess 240). The spacer 230 may be spaced apart from the recess 240 and adjacent to the central portion 241 of the recess 240 having the narrowest width. Thus, the stain transferred to the second substrate 300 by the protective layer 250 is not overlapped with the recess 240 (i.e., the emission area), and accordingly, it is possible to prevent uniformity (e.g., such as in luminance) from being negatively affected by such stain. Further, the shape of the spacer 230 may be configured to complement the shape of the central portion 241 of the recess 240, such that it is possible to prevent the light covering of the recess 240 caused by the stain transferred to the second substrate 300 while improving the emission efficiency. Since the end portion of the spacer 230 that faces the second substrate 300 has a round shape, it is possible to reduce the occurrence of a stain by minimizing the contact area between the protective layer 250 and the second substrate 300.

In a case where the spacing distance between the recess 240 and the spacer 230 is increased, the light covering of the recess 240, caused by the stain transferred to the second substrate 300, may be prevented. However, since the area of the recess 240 (e.g., emission area) is related to the emission efficiency, the emission efficiency of the organic light emitting display may be lowered by allowing the recess 240 and the spacer 230 to be spaced apart from each other, which may become problematic. Accordingly, it is desirable to effectively prevent the recess 240 and the stain transferred to the second substrate 300 from being overlapped with each other while improving the emission efficiency.

The width S1 of the central portion 241 of the recess 240 is preferably provided to be about 20% to about 60% of the width S2 of the widest portion of the upper portion 242 or the width S3 of the lower portion 243 (e.g., in a top view showing the recess 240). In a case where the width 51 of the central portion 241 is less than 20% of the width S2 of the widest portion of the upper portion 242 or the width S3 of the lower portion 243, the emission efficiency may be decreased, or stress caused by the current applied to the recess 240 may be increased, thereby reducing the lifespan of the organic light emitting display. If the width 51 of the central portion 241 exceeds 60% of the width S2 of the widest portion of the upper portion 242 or the width S3 of the widest portion of the upper portion 243, the stain transferred to the second substrate 300 by the spacer 230 (or the protective layer 250) may be overlapped with the second or third portion 242 or 243 even when the spacer 230 is provided adjacent to the central portion 241. Therefore, a luminance difference may be generated due to the partial generation of a transmittance difference.

The spacers 230 according to this embodiment are arranged in the form of dots outside of the recess 240 provided as the emission area. In this case, an upper portion of the spacer 230 (e.g., the portion of the spacer 230 facing the second substrate 300) may have a round shape such that the area of the upper portion is smaller than that of a lower portion of the spacer 230. Thus, the mask for selectively depositing the organic material on only the recess 240 is uniformly supported at a predetermined interval by the spacers 230, and hence the organic emission layer can be formed in an exact pattern (e.g., shape). Since the spacer 230 constantly maintains the interval between the first and second substrates 100 and 300 while coming in point contact with the second substrate 300, the contact area between the spacer 230 and the second substrate 300 is minimized, thereby preventing the external appearance of the organic light emitting display from being negatively affected by a stain. Although it has been described in this embodiment that the spacer 230 is distinguished from the pixel defining layer 222, the spacer 230 may be provided by patterning a portion of the pixel defining layer 222, similarly to the patterning of the recess 240 on the pixel defining layer 222. The spacer 230 may be formed of the same material as the pixel defining layer 222.

Figure 4:
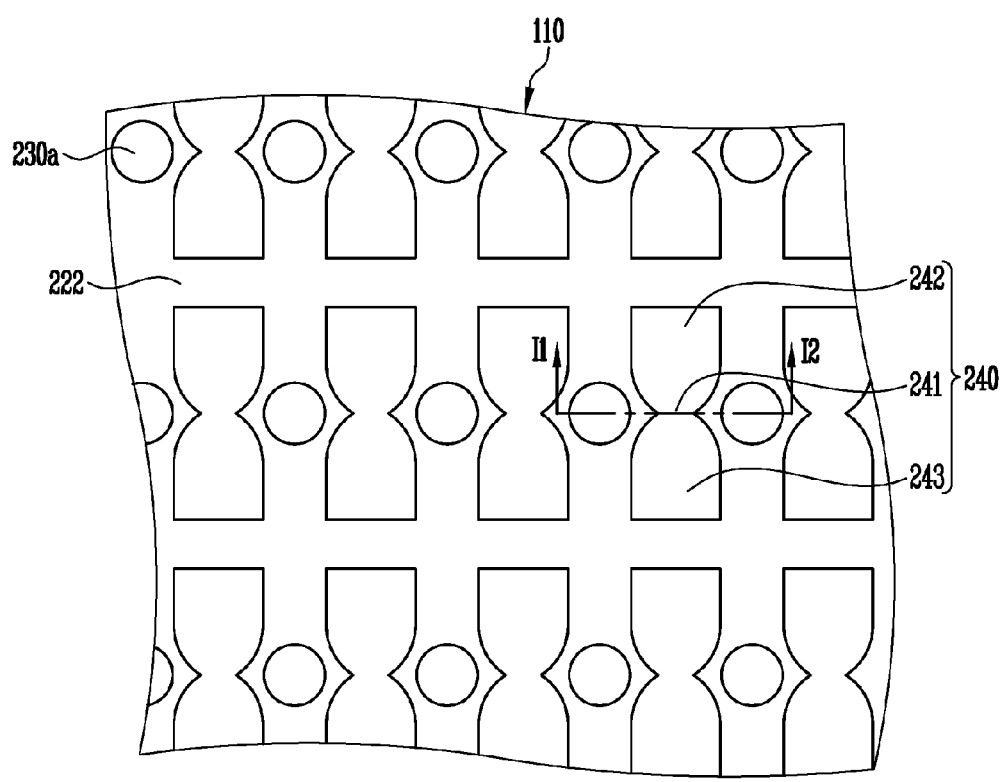
FIG. 4 is a top view showing only spacers and recesses in an organic light emitting display according to another embodiment of the present invention.

FIG. 4 is a top view showing only spacers and recesses in an organic light emitting display according to another embodiment of the present invention.

Referring to FIG. 4, the spacer 230a according to this embodiment may be provided adjacent to the central portion 241 of the recess 240 having the narrowest width, and the shape of the spacer 230a may be configured to complement the shape of the central portion 241. In this case, the cross-section of the spacer 230a that is parallel to the first substrate 100 may have a circular shape as shown in FIG. 4. Alternatively, the cross-section of the spacer 230a may have a rhomboidal shape (e.g., a rhombus) as shown in FIG. 2.

Figure 5:
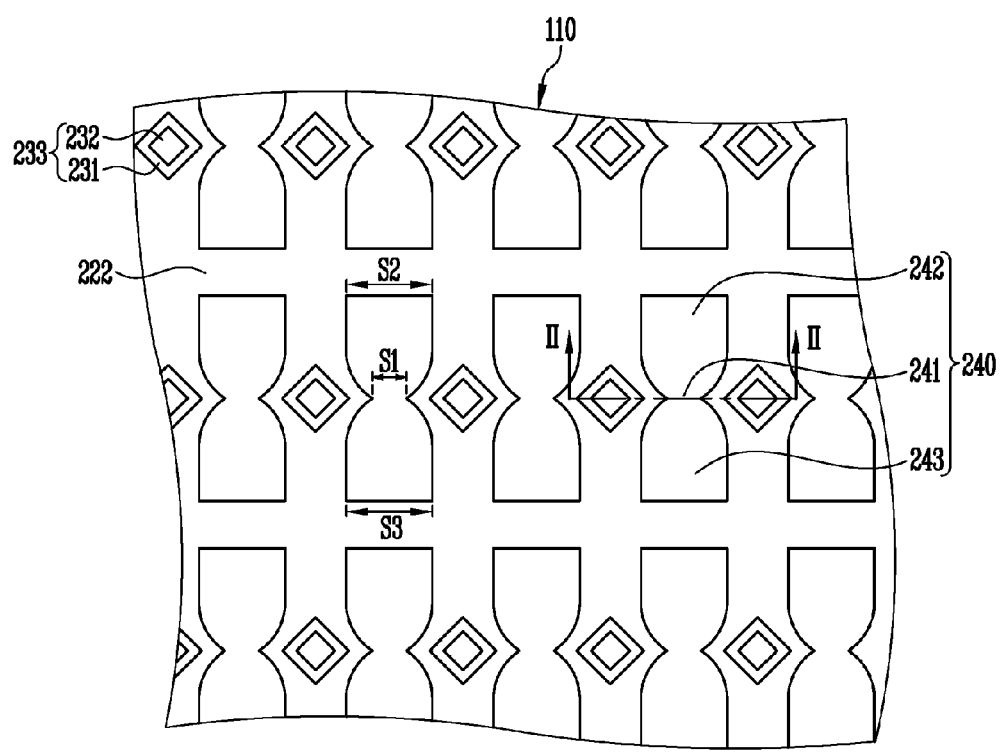
FIG. 5 is a top view showing only spacers and recesses in an organic light emitting display according to still another embodiment of the present invention.

FIG. 5 is a top view showing only spacers and recesses in an organic light emitting display according to still another embodiment of the present invention. FIG. 6 is a sectional view taken along line II-II of FIG. 5 according to an embodiment of the present invention. In the organic light emitting display according to this embodiment, contents except the following contents are similar to those of the embodiments described with reference to FIGS. 1A to 4, and therefore, their detailed descriptions will be omitted.

Referring to FIGS. 5 and 6, the pixel defining layer 222 in which the recess 240 is formed such that a portion of the first electrode 221 is not covered by the pixel defining layer 222 may be provided on the first substrate 100, and the organic emission layer 223 may be provided to cover the recess 240. A spacer 233 is provided outside the recess 240 (e.g., on the pixel defining layer 222), to support the second substrate 300 (e.g., an encapsulation substrate) opposite to the first substrate 100.

The spacer 233 according to this embodiment may include a support portion 231 adjacent to the pixel defining layer 222, and a contact portion 232 protruded toward the second substrate 300 from the support portion 231. The support portion 231 and the contact portion 232 may be provided to have different thicknesses from each other. The support portion 231 and the contact portion 232 may be formed in different shapes from each other. For example, the support portion 231 may be formed by patterning the pixel defining layer 222. The support portion 231 may be formed in a separate layer. That is, the support portion 231 and the contact portion 232 may not be formed in consecutive shapes but formed in separate shapes, such that it is possible to flexibly change the process of forming the spacer 233. Further, the support portion 231 may be formed in a shape that is wider than that of the contact portion 232, such that the spacer 233 can stably support the second substrate 300. In addition, the contact portion 232 may be formed thinner than the support portion 231, such that it is possible to prevent a stain formed on the second substrate 300.

As described above with respect to the various embodiments of the present invention, it is possible to provide an organic light emitting display having a spacer that can minimize the contact area between the spacer and an encapsulation substrate.

Further, it is possible to provide an organic light emitting display which can prevent a stain transferred to an encapsulation substrate by an external force from overlapping with an emission layer.

Further, it is possible to provide an organic light emitting display that can improve emission efficiency by providing shapes of a new opening and a new spacer, and ensure the uniformity of luminance (e.g. based on transmittance).

Example embodiments have been disclosed herein, and although specific terms are employed, they are used and are to be interpreted in a generic and descriptive sense only and not in a limiting manner. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An organic light emitting display, comprising:
   a first substrate comprising a major surface; and
   a pixel array formed over the major surface of the first substrate, the pixel array comprising a plurality of pixels formed over the first substrate and a plurality of spacers arranged over the first substrate, and each pixel comprising a first electrode and an organic emission layer formed over the first electrode,
   the pixel array providing a plurality of recesses and a plurality of bumps, the plurality of recesses corresponding to the first electrodes of the plurality of pixels and the plurality of bumps corresponding to the plurality of spacers,
   wherein when viewing the pixel array from the top in a first direction perpendicular to the major surface, each spacer is interposed between two immediately neighboring recesses along a second direction parallel to the major surface and has an outward portion having a width taken along the second direction that is greater than a width of another portion of the spacer taken along the second direction, and each recess has an inward portion having a width taken along the second direction that is smaller than a width of another portion of the recess taken along the second direction, the outward portions of the plurality of spacers being aligned with the inward portions of the plurality of recesses along the second direction.

2. The organic light emitting display of claim 1, wherein each spacer comprises a base portion and a top portion placed on the base portion, the base portion is wider than the top portion in a cross section taken by a plane parallel to the first axis and perpendicular to the major surface.

3. The organic light emitting display of claim 2, wherein the tip of the top portion is rounded.

4. The organic light emitting display of claim 1, wherein the plurality of spacers are generally semicircular in a cross section taken by a plane parallel to the first axis and perpendicular to the major surface.

5. The organic light emitting display of claim 1, wherein the pixel array further comprises:
   a second electrode formed over the organic emission layer and the plurality of spacers; and
   a protective layer formed on the second electrode.

6. The organic light emitting display of claim 1, wherein the width of the recess is the shortest when measured along a first axis along which the plurality of spacers and the plurality of recesses are arranged and gradually increases when measured along another axis parallel to the first axis.

7. The organic light emitting display of claim 6, wherein when viewing the pixel array in the first direction, the each recess has a center line along the first axis, and the center line is equidistant from each of the two ends of the recess along a second axis that is perpendicular to the first axis and parallel to the major surface.

8. The organic light emitting display of claim 6, wherein when viewing the pixel array in the first direction, each recess has a center line that divides the recess into first and second portions, the widest width of the first portion measured along the second direction is substantially equal to the widest width of the second portion measured along the second direction.

9. The organic light emitting display of claim 8, wherein the width of the recess along the center line is about 20% to about 60% of the widest width of the first or second portion.

10. The organic light emitting display of claim 6, wherein each spacer is closer to a central portion of an immediately neighboring recess along a third direction that is perpendicular to the first and second directions than to end portions of the immediately neighboring recess along the third direction.

11. The organic light emitting display of claim 6, wherein when viewing the pixel array in the first direction, the outward portion of each spacer complements the inward portion of an immediately neighboring recess.

12. The organic light emitting display of claim 1, wherein when viewing the pixel array in the first direction, each spacer has a shape that is generally circular or rhomboidal.

13. The organic light emitting display of claim 1, further comprising a thin film transistor coupled to the first electrode.

14. The organic light emitting display of claim 1, further comprising a second substrate disposed opposite to the first substrate, the second substrate being spaced apart from the first substrate at a predetermined interval by the plurality of spacers.

* * * * *